US008199039B2

(12) United States Patent
Mattisson

(10) Patent No.: US 8,199,039 B2
(45) Date of Patent: Jun. 12, 2012

(54) DELTA-SIGMA ANALOG-TO-DIGITAL CONVERTER, RADIO RECEIVER, COMMUNICATION APPARATUS, METHOD, AND COMPUTER PROGRAM

(75) Inventor: Sven Mattisson, Bjarred (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 12/997,602

(22) PCT Filed: May 15, 2009

(86) PCT No.: PCT/EP2009/055905
§ 371 (c)(1),
(2), (4) Date: Dec. 12, 2010

(87) PCT Pub. No.: WO2010/000538
PCT Pub. Date: Jan. 7, 2010

(65) Prior Publication Data
US 2011/0096878 A1 Apr. 28, 2011

Related U.S. Application Data

(60) Provisional application No. 61/077,714, filed on Jul. 2, 2008.

(30) Foreign Application Priority Data

Jul. 1, 2008 (EP) .................................. 08159460

(51) Int. Cl.
*H03M 3/04* (2006.01)
(52) U.S. Cl. ...................................................... 341/143
(58) Field of Classification Search ................... 341/143
See application file for complete search history.

(56) References Cited

U.S. PATENT DOCUMENTS
5,870,048 A 2/1999 Kuo et al.
(Continued)

FOREIGN PATENT DOCUMENTS
WO 02/03747 A 1/2002

OTHER PUBLICATIONS

PCT Search Report, mailed Dec. 14, 2009, in connection with International Application No. PCT/EP2009/055905.

*Primary Examiner* — Howard Williams
(74) *Attorney, Agent, or Firm* — Potomac Patent Group PLLC

(57) ABSTRACT

A delta-sigma analog-to-digital converter (ADC) is disclosed. The ADC comprises a forward path structure; a feedback structure; and a first subtraction element arranged to receive an input signal to the delta-sigma analog-to-digital converter and a feedback signal from the feedback structure and output a difference signal, which is a difference between the input signal and the feedback signal, to the forward path structure, wherein the forward path structure comprises a quantizer arranged to convert an analog input signal to a digital representation; a forward path filter arranged to input the difference signal and provide an output signal to the quantizer, and the feedback structure comprises a first and a second branch, wherein the first branch comprises a first digital-to-analog converter arranged to provide output signals to the subtraction element; and a first feedback filter having a gain to frequency characteristic such that frequencies that are desired in the analog-to-digital conversion, compared to undesired frequencies, are attenuated in the feedback structure, and the second branch comprises a second digital-to-analog converter, wherein the first and second branches are fed by the digital representation and the outputs of the first and second branches are merged in a second subtraction element arranged to output a signal, which is a difference between the signals from the first and second branches, to the first subtraction element. A radio receiver, communication apparatus, method for analog-to-digital conversion, and computer program for implementing the method are also disclosed.

34 Claims, 7 Drawing Sheets

U.S. PATENT DOCUMENTS

| | | |
|---|---|---|
| 6,147,634 A | 11/2000 | Rangan et al. |
| 6,362,762 B1 * | 3/2002 | Jensen et al. ................ 341/143 |
| 8,072,363 B2 * | 12/2011 | Yu et al. ................ 341/143 |
| 2005/0093726 A1 | 5/2005 | Hezar et al. |

* cited by examiner

DELTA-SIGMA ANALOG-TO-DIGITAL CONVERTER, RADIO RECEIVER, COMMUNICATION APPARATUS, METHOD, AND COMPUTER PROGRAM

CROSS REFERENCE TO RELATED APPLICATIONS

This application claims priority under 35 U.S.C. §119 to European Patent Application No. EP08159460.8, filed on Jul. 1, 2008, which is hereby incorporated herein by reference in its entirety. This application also claims the benefit of U.S. Provisional Application No. 61/077,714, filed Jul. 2, 2008, which is hereby incorporated herein by reference in its entirety.

TECHNICAL FIELD

The present invention relates to a delta-sigma analog-to-digital converter, a radio receiver comprising such a converter, a communication apparatus comprising such a radio receiver, a method for delta-sigma analog-to-digital conversion, and a computer program for implementing the method.

BACKGROUND

In for example a radio receiver, a received radio frequency (RF) signal, after mixing to base band or low intermediate frequency, is desired to be converted into a digital representation. This is performed by an analog-to-digital converter (ADC). The conversion of these signals implies different demands compared to other lower frequency band conversions, such as audio signals. The analog baseband signal may further comprise signal components that are undesired, e.g. at channels adjacent to the wanted channel to be received by the radio receiver. These undesired signal components may be suppressed before the ADC by one or more filters, such as channel-select filters (CSF) to reduce the ADC dynamic and frequency range requirements. Because the CSF has limited adjacent channel suppression, for component tolerance and signal integrity reasons, the signal level out from the CSF may be set by a strong adjacent channel. Thus, the ADC may need a higher dynamic range than what is actually required by the desired signal alone. The desired signal will then only benefit from a part of the dynamic range provided by the ADC, and to provide dynamic range enough for the desired signal, the dynamic range of the ADC will need to be increased compared to what is necessary for the desired signal alone. This extra dynamic range increases complexity, size and power consumption of the ADC. It is therefore a problem how to make more of the dynamic range of the ADC available to the desired signal.

SUMMARY

An object of the invention is to at least alleviate the above stated problem. The present invention is based on the understanding that a delta-sigma ADC can be used, wherein feedback is provided by filtering for channel selection.

According to a first aspect, there is provided a delta-sigma analog-to-digital converter comprising a forward path structure; a feedback structure; and a first subtraction element arranged to receive an input signal to the delta-sigma analog-to-digital converter and a feedback signal from the feedback structure and output a difference signal, which is a difference between the input signal and the feedback signal, to the forward path structure. The forward path structure comprises a quantizer arranged to convert an analog input signal to a digital representation; and a forward path filter arranged to input the difference signal and provide an output signal to the quantizer. The feedback structure comprises a first and a second branch, wherein the first branch comprises a first digital-to-analog converter arranged to provide output signals to the subtraction element; and a first feedback filter having a gain to frequency characteristic such that frequencies that are desired in the analog-to-digital conversion, compared to undesired frequencies, are attenuated in the feedback structure, and the second branch comprises a second digital-to-analog converter. The first and second branches are fed by the digital representation and the outputs of the first and second branches are merged in a second subtraction element arranged to output a signal, which is a difference between the signals from the first and second branches, to the first subtraction element.

The feedback structure may further comprise one or more further branches, wherein any of the one or more further branches comprises a digital-to-analog converter and a feedback filter having a gain to frequency characteristic such that frequencies that are desired in the analog-to-digital conversion, compared to undesired frequencies, are attenuated in the feedback structure, wherein the one or more further branches are fed by the digital representation and the outputs of the one or more further branches are merged with outputs of the first and second branches in at least one subtraction element.

The first and second subtraction elements may be integrated into one subtraction element.

Any of the first and second subtraction element may comprise a summing circuit; and a sign reversing circuit arranged on the signal path to be subtracted.

Any of the digital-to-analog converters may be arranged to operate at different bit rates to each other. The second digital-to-analog converter may be arranged to run at a higher bit rate than the first digital-to-analog converter.

The input of the second digital-to-analog converter may be connected directly to the output of the quantizer.

The second branch may comprise a second feedback filter.

The digital-to-analog converters may be arranged to operate at different resolutions compared to each other.

At least one of the feedback filters may be a digital filter connected between the output of the quantizer and the input of the corresponding digital-to-analog converter.

At least one of the feedback filters may be an analog filter connected between the corresponding digital-to-analog converter and the input of the first subtraction element.

The converter may be arranged to operate on a continuous time basis, or on a discrete time basis. For the discrete time basis operation, at least one of the at least one digital-to-analog converter may be arranged to operate at a different bit rate than the quantizer.

The forward path may comprise one or more local feedback paths arranged to affect the forward path transfer function.

At least one of the at least one digital-to-analog converter may be arranged to operate at a different resolution than the quantizer.

Gain and/or frequency response of any of the feedback filters may be dynamically configurable.

According to a second aspect, there is provided a radio receiver comprising a delta-sigma analog-to-digital converter for analog-to-digital conversion according to the first aspect.

According to a third aspect, there is provided a communication apparatus comprising a radio receiver according to the second aspect.

According to a fourth aspect, there is provided a method for delta-sigma analog-to-digital conversion of base band signals comprising subtracting a feedback signal of a feedback structure from an input signal to provide a difference signal; filtering the difference signal by a forward path filter to provide an analog forward path signal; quantizing the forward path signal to a digital representation; feeding back the digital representation by the feedback structure, wherein the feedback structure comprises a first branch comprising a first feedback filter and a first digital-to-analog converter and a second branch comprising a second digital-to-analog converter, to provide the feedback signal, wherein the feeding back comprises feeding the first and second branches by the digital representation; filtering according to a gain to frequency characteristic such that frequencies that are desired in the analog-to-digital conversion, compared to undesired frequencies, are attenuated in the feedback structure; converting according to a digital-to-analog conversion in the feedback structure; and subtracting the outputs of the first branch from the second branch to output the feedback signal.

The feedback structure may further comprise one or more further branches, wherein any of the one or more further branches comprises a digital-to-analog converter and a feedback filter, and the feeding back may comprise feeding the one or more further branches by the digital representation; filtering in the one or more further branches according to a gain to frequency characteristic such that frequencies that are desired in the analog-to-digital conversion, compared to undesired frequencies, are attenuated in the feedback structure; converting in the one or more further branches according to a digital-to-analog conversion in the feedback structure; and merging outputs of the one or more further branches with outputs of the first and second branches in at least one subtraction element.

The method may further comprise operating the digital-to-analog converters at different bit rates compared to each other. The method may further comprise operating the second digital-to-analog converter at a higher bit rate than the first digital-to-analog converter.

The converting operated by the second digital-to-analog converter may be performed directly on the digital representation.

The method may further comprise operating the digital-to-analog converters at different resolutions compared to each other.

The filtering in the feedback structure may comprise analog filtering and/or digital filtering.

The delta-sigma analog-to-digital conversion may be operated on a continuous time basis, or on a discrete time basis. For the discrete time basis operation, the method may further comprise operating at least one of the digital-to-analog conversions at a different bit rate than the quantizing.

The method may further comprise operating at least one of the at least one digital-to-analog conversions at a different resolution than the quantizing.

The forward path may comprise one or more local feedback paths, and the filtering of the difference signal may further comprise affecting the forward path transfer function by locally feeding back signals in the forward path.

The method may further comprise dynamically configuring gain and/or frequency response of any of the feedback filters.

According to a fifth aspect, there is provided a computer program comprising computer program code comprising instructions to cause a processor on which the computer program code is executed to perform the method according to the fourth aspect.

An advantage of an embodiment is that loop stability is maintained although filter capabilities are introduced in the feedback structure. Loop dynamics are preserved around loop cut-off frequency. The enhanced frequencies will be the same as the feedback filter response of feedback filter, and thus, to adopt to different communication standards, only the change of the pass-band of the feedback filter is required.

Here it should be noted that ADCs can employ local feedback loops to shape the forward path response. Such local feedback loops sense the signal e.g. at the ADC output or elsewhere in the ADC, and feed it back into the forward path to any element within the forward path, i.e. to a location that is not the ADC input or the main input to the forward path. The effect of a local feedback loop is to contribute to the forward path transfer function, but it does not define the over-all gain other than via the forward path contribution to the over-all gain. Thus, the gain of the ADC is primarily defined by the global feedback path, that is the path from the output of the ADC to the main input of the forward path. Thus, where this disclosure refers to the term 'feedback path', unless explicitly stated as a local feedback path, the meaning of the term is a global feedback path. Any local feedback path is considered to be accounted for by the forward path transfer function, and is not part of the general approach of this disclosure and not giving the special effects thereof more than contributing to features of the forward path, as will be understood when taking note of this disclosure.

DETAILED DESCRIPTION

Figure 1:
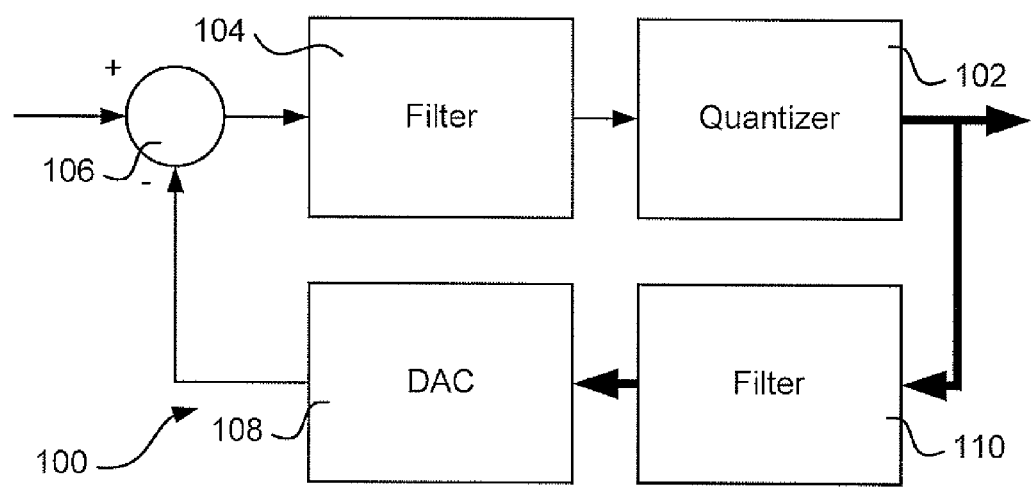
FIGS. 1 to 9 schematically illustrate different embodiments of the proposed delta-sigma ADCs.

For the understanding of the invention, an application of a radio frequency (RF) ADC, i.e. an ADC suitable for conversion of e.g. a base band signal into a digital representation, will first be elucidated. Zero and low intermediate frequency (IF) receiver architectures are popular for wireless devices, such as communication apparatuses, e.g. mobile phones. For such receivers, the wanted RF signal is down-converted to a base band signal at zero or close to zero frequency by a receiver mixer. Before this mixer, the only frequency selectivity provided is, typically, band selectivity via a duplexer or a receiver filter, such as a surface-acoustic wave (SAW) filter, for frequency division duplex (FDD) or time-division duplex (TDD) systems, respectively. In the received band, adjacent-channel signals may be much stronger than the wanted signal. These adjacent-channel signals are typically suppressed by one or more channel-select filters following the receiver mixer. Up to the CSF all circuitry has to support the full spuriuous-free dynamic range (SFDR) of the wanted signal and adjacent-channel signals including sufficient margin to the noise and interference floor required for proper signal detection. For a low-noise amplifier (LNA) of the receiver, the floor is determined by the thermal noise of its input signal and the maximum signal is limited by the supply voltage and its bias current. For subsequent stages the signal power is increased, and for power-consumption reasons this means some voltage gain (say 30 dB) is applied stressing the upper limit of the dynamic range as the supply voltage is about the same for all the circuitry. To relax the dynamic-range (DR) requirements channel-select filtering is applied and ideally, i.e. filters with infinitly steep slope, infinite attenuation in stop-band and no attenuation in pass-band, this would result in only the wanted signal challenging the upper limit of the DR. A real receiver typically implements the CSF as a passive pole at the mixer output followed by an active ladder, or bi-quad based, low-pass or band-pass filter resulting in a finite attenuation of the adjacent-channel signals. To keep the thermal noise low, the filter capacitors have to be relatively large, i.e. the available thermal noise voltage $v_n$ across a capacitor C, is $v_n^2 = kT/C$, where k is Boltzmann's constant and T is the absolute temperature, and they add significantly to the circuit area, and hence cost. These capacitors also add to the power consumption as a lot of power is required to drive them without generating too much distortion, which would result in inter-modulation noise. In a multi-standard, e.g. GSM and WCDMA receiver the CSF response has in such case to be optimized for each mode, either by shifting the filter poles or by switching between fixed frequency filters, otherwise adjacent-channel suppression will be effective only for the mode with the widest bandwidth.

After the CSF the resulting signal is digitized in an ADC. As stated above, the analog CSF has limited adjacent-channel suppression, and the maximum voltage level of the signal out of the CSF will be set by a strong adjacent channel. Thus, the ADC typically has to have a higher dynamic range than what is required by the wanted signal alone. In practice this is accomplished by letting the wanted signal stay well below the ADC clipping level, except perhaps for the case when the wanted signal is approaching its maximum signal level in which case it is at least as strong as the adjacent channel and no extra DR margin is needed. An extra DR margin increases the complexity, size, and power consumption of the ADC. The clipping point of the ADC is close to the compression point of the ADC, i.e. $CP_i$ and $CP_o$ for input- and output-referred compression point, respectively, which is a more convenient way to measure the maximum signal level. The $CP_i$ and $CP_o$ are defined as the input and output signal level, respectively, where the gain drops or deviates by 1 dB from its small-signal value.

An common ADC topology is the delta-sigma ADC, where an input signal is fed through a filter, e.g. a set of integrators, to reach a quantizer. The quantizer normally only has a few output bits, e.g. 1, 2 or 4, although more is feasible, sampled at a rate much higher than the signal bandwidth. An example is where the quantizer is just a single bit comparator. The quantizer output, i.e. a digital representation, is routed to a digital-to-analog converter (DAC) whose output is subtracted from the input signal at the ADC input forming a feedback loop. The quantizer output is also the digitized output of the ADC.

Here it should be noted that ADCs can employ local feedback loops to shape the forward path response. Such local feedback loops sense the signal e.g. at the ADC output or elsewhere in the ADC, and feed it back into the forward path to any element within the forward path, i.e. to a location that is not the ADC input or the main input to the forward path. The effect of a local feedback loop is to contribute to the forward path transfer function, but it does not define the over-all gain other than via the forward path contribution to the over-all gain. Thus, the gain of the ADC is primarily defined by the global feedback path, which is the path from the output of the ADC to the main input of the forward path. Thus, where this disclosure refers to the term 'feedback path', unless explicitly stated as a local feedback path, the meaning of the term is a global feedback path. Any local feedback path is considered to be accounted for by the forward path transfer function, and is not part of the general approach of this disclosure and not giving the special effects thereof more than contributing to features of the forward path, as will be understood when taking note of this disclosure.

The delta-sigma ADC, thus, acts like a voltage follower, where the digital stream represents the input signal. To enhance the ADC resolution, the digital ADC output stream is filtered and down-sampled to provide further selectivity and increased resolution of the wanted signal, at the expense of signal bandwidth. For in-band signals the delta-sigma ADC clipping occurs in the last stage, i.e. the quantizer, and results in an output sequence with mostly ones, or zeroes, for a single-bit comparator, or for a multi-bit quantizer it results in mostly sequences of the highest or the lowest code.

The delta-sigma ADC can be continuous or discrete time. In the former case the ADC filter is an analog continuous-time filter and sampling is done by the quantizer, and in the latter case, sampling is done before the ADC and the entire ADC is sampled, typically with switched-capacitor filters in the forward path. For noise reasons the ADC filter typically have a similar complexity as the preceding analog channel-select filter.

The inventors have found, to further increase receiver integration it would be desirable to combine the ADC and channel-select filters. For multi-standard receivers it may also be desirable to move most of the selectivity into the digital domain where a flexible and tighter filter response can be accomplished. As will be demonstrated with reference to FIGS. 1 to 9, this is accomplished by the feedback of the delta-sigma ADC provided by filtering for channel selection.

For the sake of completeness, a discussion on a rejected alternative solution will also be demonstrated. An attempt to suppress adjacent channel signals in the forward path filter of the delta-sigma ADC has shown that it is not successful. For simplicity, assume a large over-sampling factor, such that the delta-sigma ADC can be modelled in the complex frequency, or s, domain. Applying a classical feedback model gives us $$\begin{cases} V_e = V_i - \beta V_o \\ V_o = A V_e, \end{cases}$$

where $V_i$ is the input signal, $V_e$ is the signal to the forward path filter, $V_o$ is the output from the quantizer, A is the forward path gain, and $\beta$ is the feedback gain. Explicit frequency dependence has been dropped for notational simplicity and the forward path may comprise one or more local feedback loops to accomplish the over-all forward path gain A. Assigning T=$\beta$A and F=T+1, the equations can be reformulated as $$\begin{cases} V_e = V_i \dfrac{1}{1+\beta A} = \dfrac{V_i}{F} \\ V_o = V_i \dfrac{A}{1+\beta A} = \dfrac{V_i T}{\beta F}, \end{cases}$$

from which we can get the closed loop gain $$A_f = \frac{V_o}{V_i} = \frac{A}{1+\beta A} = \frac{1}{\beta}\frac{T}{F} = \frac{1}{\beta}\frac{F-1}{F}.$$

Augmenting the feedback model with a forward path loop-filter response $H_A$ and quantizer gain $G_q$, where $A = H_A \cdot G_q$, and noise $v_{nq}$, we get $$\begin{cases} V_e = V_i - \beta V_o \\ V_o = H_A G_q V_e + v_{nq}, \end{cases}$$

where the quantizer noise depends on quantizer resolution $\Delta V$ according to the relation $v_{nq} = \Delta V/\sqrt{12}$. This gives us $$\begin{cases} V_e = \frac{1}{F}(V_i - \beta v_{nq}) \\ V_o = V_i \frac{H_A G_q}{F} + v_{nq}\frac{1}{F}, \end{cases}$$

which leads to the delta-sigma ADC closed loop and noise transfer gains $$A_f + A_{fq} = \frac{V_o}{V_i} = \frac{1}{\beta}\left(1 + \frac{v_{nq}}{V_i}\frac{1}{H_A G_q}\right)\frac{F-1}{F} \approx \frac{1}{\beta}\left(1 + \frac{v_{nq}}{V_i}\frac{1}{H_A G_q}\right)$$

where the approximation is valid when $F = 1 + H_A G_q \gg 1$.

This shows that the delta-sigma ADC gain is given by the inverse feedback factor $1/\beta$. Shaping the filter response $H_A(s)$ to suppress adjacent channel signals, e.g. by using local feedback, will, thus, not be effective until the loop gain gets very low, i.e. $H_A G_q \lesssim 1$. For practical loop filters, the ADC response will be almost unity, and output clipping will occur at the same level, independent of the signal frequency. Attenuating the adjacent channel signals by shaping the forward loop filter will also severely impact the quantizer noise as the term $1/H_A G_q$ will grow for frequencies where $H_A$ nulls the adjacent channels.

Traditionally, the feedback factor β is constant and given by the feedback DAC gain. As the DAC also traditionally is oversampled by the same amount as the quantizer, it has a flat frequency response in the frequency band of interest, i.e. no suppression of neighbouring adjacent channels. However, by adding a filter in the feedback path according to the approach of the invention, it is possible to shape the delta-sigma ADC transfer function.

FIG. 1 schematically illustrates a delta-sigma ADC 100 comprising a forward path structure comprising a quantizer 102 and a forward path filter 104, possibly including local feedback loops. The delta-sigma ADC 100 further comprises a subtraction element 106, and a feedback structure comprising a digital-to-analog converter (DAC) 108 and a feedback filter 110. The feedback structure provides a feedback signal to the subtraction element 106, which is arranged to receive an input signal to the delta-sigma analog-to-digital converter and the feedback signal from the feedback structure and output a difference signal, which is a difference between the input signal and the feedback signal, to the forward path structure, i.e. to the forward path filter 104, such that the quantizer is able to work on the signal. In the figure, bold lines illustrate flow of digital represented signals, while other arrowed lines illustrate analog signals.

The quantizer 102 is arranged to convert an analog input signal provided from the forward path filter 104 to a digital representation, which also is the output of the delta-sigma ADC 100. This digital representation is also provided to the feedback filter 110, which works in the digital domain and thus is implemented as a digital filter. An advantage of having the feedback filter 110 to work in the digital domain is that it enables design of a flexible and efficient filter. The digitally filtered signal is provided to the DAC 108 which converts it to an analog signal which is provided to the subtraction element 106. The feedback filter 110 has a gain to frequency characteristic such that frequencies that are desired in the analog-to-digital conversion, compared to undesired frequencies, are attenuated in the feedback structure. This implies that the delta-sigma ADC 100 amplifies signals in the desired frequency range, and will thus act as a filter as well as an ADC. With similar notation as the non-filtered feedback loop elucidated above, the clipping level of the delta-sigma ADC is given by its output level, i.e. digital representation or code, here is provided a higher input referred clipping point for the adjacent channel signals compared to the desired signal, i.e. clipping point $CP_o$ is the defining parameter and $CP_i = CP_o/A_f$. Since the term $H_A G_q$ does not depend on the feedback filter function $H_\beta$ of the feedback filter 110, the same relative quantizer noise is provided here as in the non-feedback-filtered example. If the feedback filter 110 has a high-pass characteristic and no significant feedback loop delay, upon proper implementation, the loop stability properties will be maintained. Other filter characteristics than high-pass is also possible, e.g. band-pass characteristics. For stability reasons, it is desired to keep latency low. The frequency response of the feedback filter 110 is preferred to be relatively flat for desired signals, but with a lower gain than for undesired signals. Thus, a high-pass filter can have a stair-like response, which can, e.g., be accomplished either by conventional filter techniques or by adding two paths of different gains and frequency responses.

Figure 2:
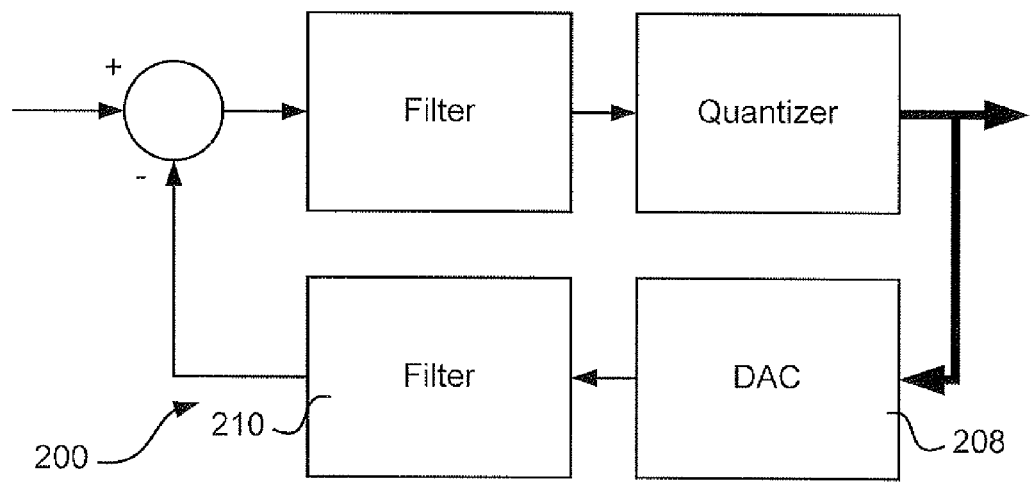

FIG. 2 schematically illustrates a delta-sigma ADC 200 similar to the one illustrated in FIG. 1, but with its feedback filter 210 operating in the analog domain. Thus, it is conceivable to have the feedback filter 210 between the DAC 208 and the ADC input. This filter then have to be an analog filter. To enhance the desired signal, this analog filter will in principle have to be similar to the CSF, which traditionally also is an analog filter applied before the ADC, but here incorporated in the ADC 100, but with inverse filter characteristics regarding frequencies. Other features are similar to the ADC of FIG. 1.

Figure 3:
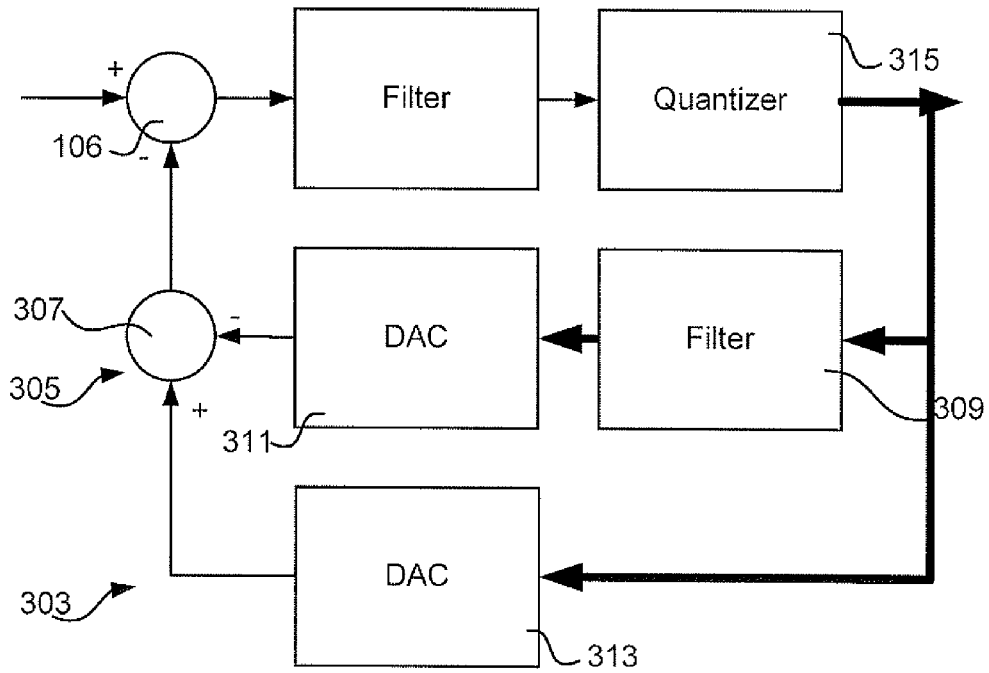
Figure 4:
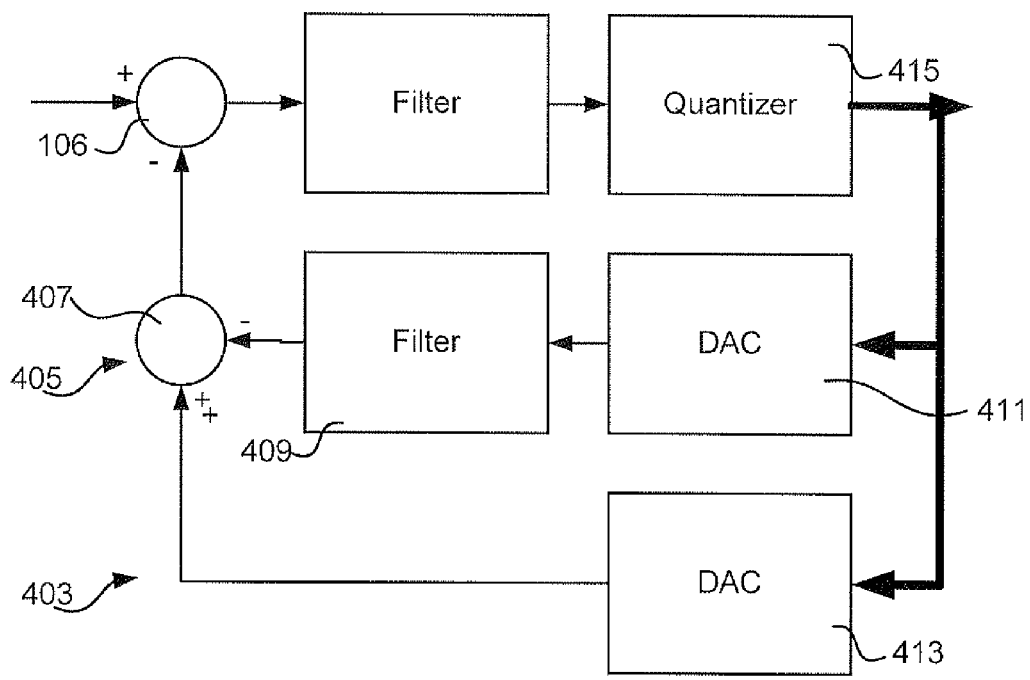

In case no additional loop delay can be accepted, the feedback structure can be implemented as schematically illustrated in FIGS. 3 and 4 for the digital and analog implementation of the feedback filter, respectively. Here, there is a combination of a direct path 303, 403 and a filtered path 305, 405 for the feedback signals. An additional subtraction element 307, 407 compared to the embodiments described with reference to FIGS. 1 and 2, respectively, is provided, which also can be used for scaling the filtered and direct paths, if not performed in the paths directly. For example, the filtered path can have 90% of the gain of the direct path to get an attenuation of the desired signal. Because of the direct path, there is no delay added, and loop dynamics are preserved around the loop cut-off frequency. The enhanced frequencies will be the same as filter response $H_{\beta_2}$ for the feedback filter 309, 409 and thus, to adopt to different standards only require a change of pass-band, which is particularly feasible for the digital filter 309 of the embodiment illustrated in FIG. 3. Here, the $H_{\beta_2}$ roll-off can be made quite steep. Subtraction elements 309 and 409 are shown as separate blocks, but can be combined with 106 into one block. Subtraction elements are shown with one positive and one negative input, but these can also be realised as summing circuits, provided that the proper sign reversal of one or more components in the corresponding signal path is performed.

For applications in zero-IF it is desirable to enhance the IF frequencies from zero frequency (DC) to half the RF signal bandwidth, which can be accomplished e.g. when the feedback filter characteristics $H_{\beta_2}$ implements a low-pass filter of the same bandwidth as the signal and centred at the IF frequency. In the case of a low-IF receiver, the filter characteristics $H_{\beta_2}$ can be a band-pass filter of the same bandwidth as the signal and centred at the IF frequency.

For another application of the principles of the present invention, the filter can be a sharp band-pass filter centred at an adjacent channel interferer. If the centre frequency gain is properly selected regarding sign, the feedback signal will be amplified, resulting in an over-all suppression of these frequencies and the compression point increased, as long as dynamics of the feedback DAC allow it. As an example, it is possible to efficiently suppress a narrow-band GSM interferer close to a wide LTE channel, or similar situation. Optimization of the filter characteristics for different cellular standards is thus feasible. This can be performed dynamically by having reconfigurable gain and frequency response for the filters, which can be controlled by a communication apparatus having a receiver with an RF delta-sigma ADC according to the approach of the present invention. The control can be based on information provided in a control program of the communication apparatus, and possibly with aid of information provided from a communications system in which the communication apparatus operates.

The DACs 311, 313; 411, 413 can operate at different rates and at different resolutions to each other and to the quantizer 315, 415 if desired. For example, the direct path DAC 313, 413 can operate at a higher rate than the filtered path DAC 311, 411, wherein the filter function of the filter 309, 409 may be enhanced while maintaining stability in the loop. Similar applies to resolution, where higher resolution in the filtered path can enhance filtering. These features can be applied sole or in combination.

Other features of the embodiments illustrated in FIGS. 3 and 4 are similar to those of the embodiments illustrated in FIGS. 1 and 2, respectively.

A particular advantage of the embodiments described with reference to FIGS. 3 and 4 is that no additional loop delay is introduced, which implies that loop stability is maintained although filter capabilities are introduced in the feedback structure. This is due to the direct path 303, 403, wherein loop dynamics are preserved around loop cut-off frequency. The enhanced frequencies will be the same as the feedback filter response of feedback filter 309, 409, and thus, to adopt to different standards, only the change of the pass-band of the filter 309, 409 is required.

Figure 5:
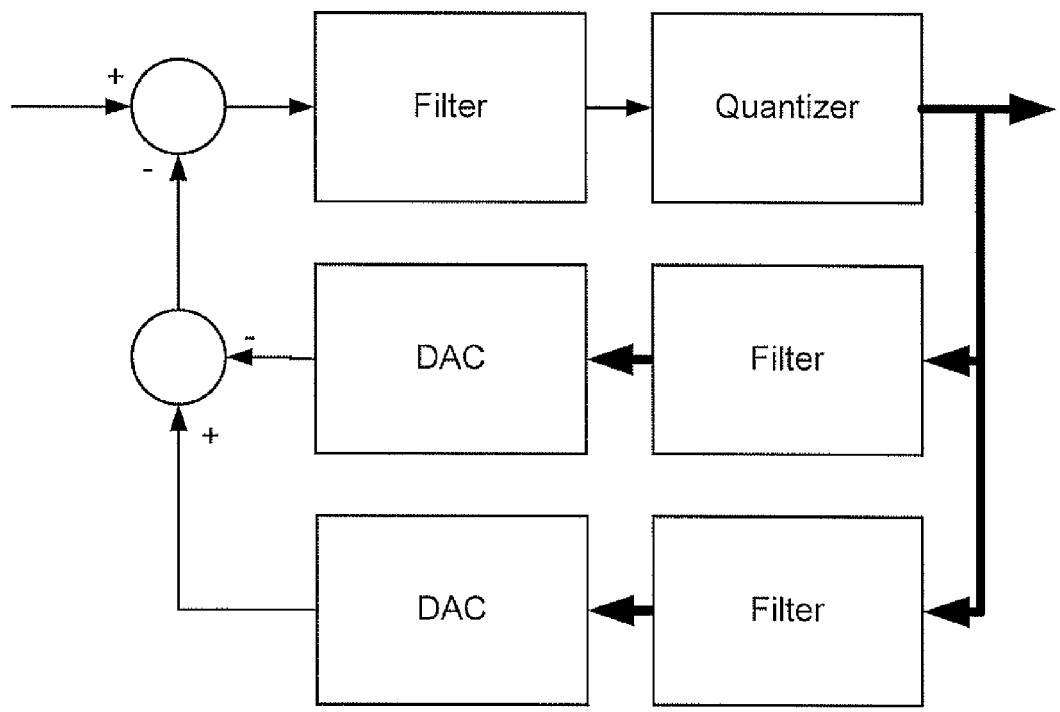
Figure 6:
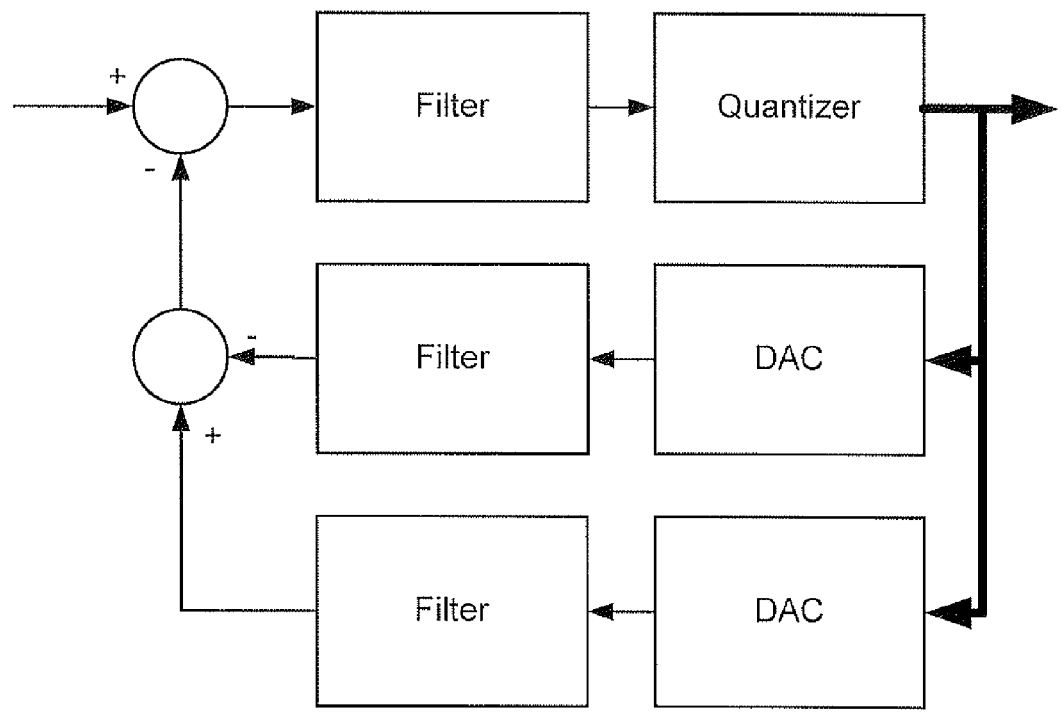
Figure 7:
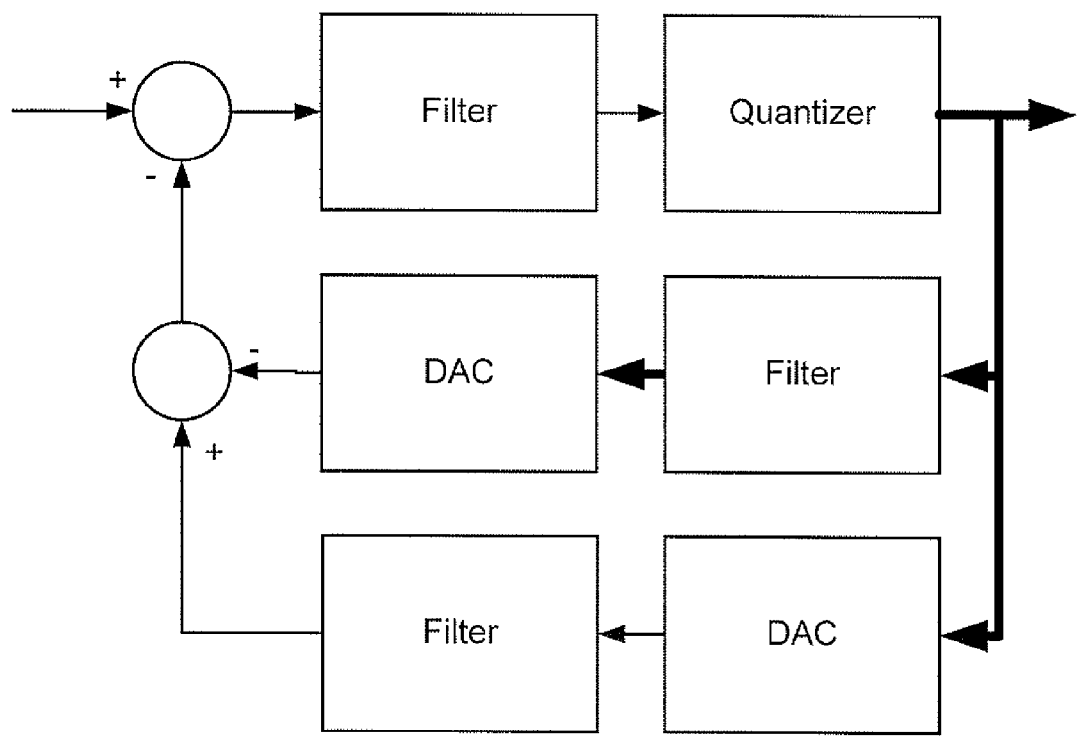
Figure 8:
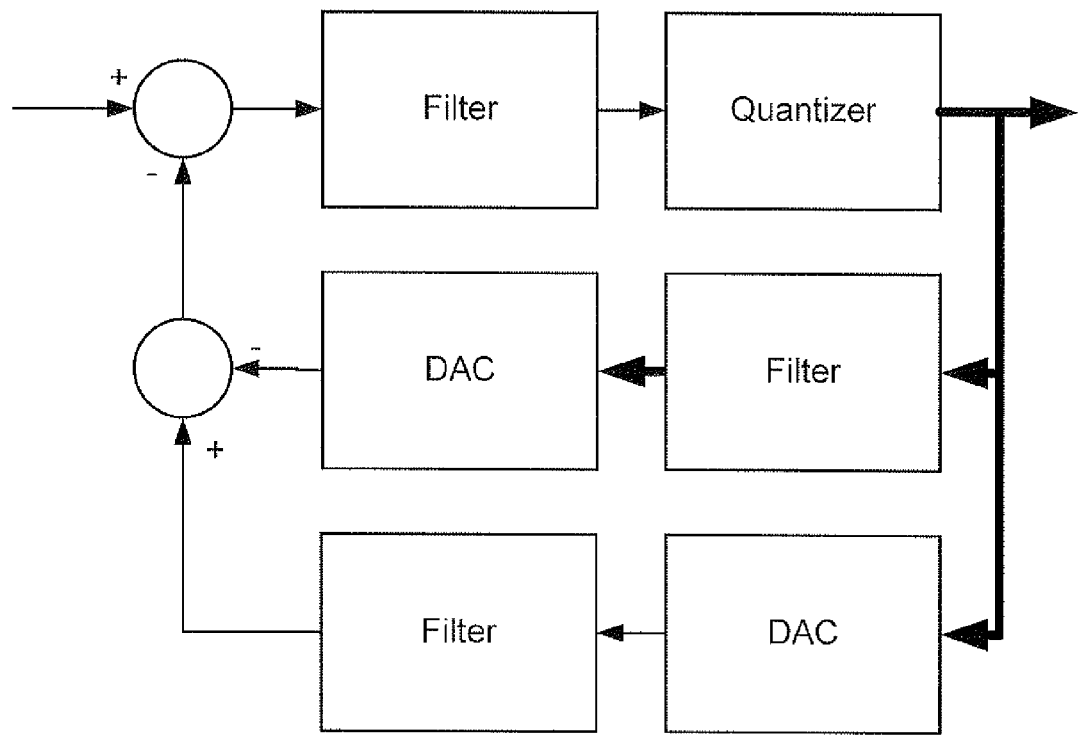
Figure 9:
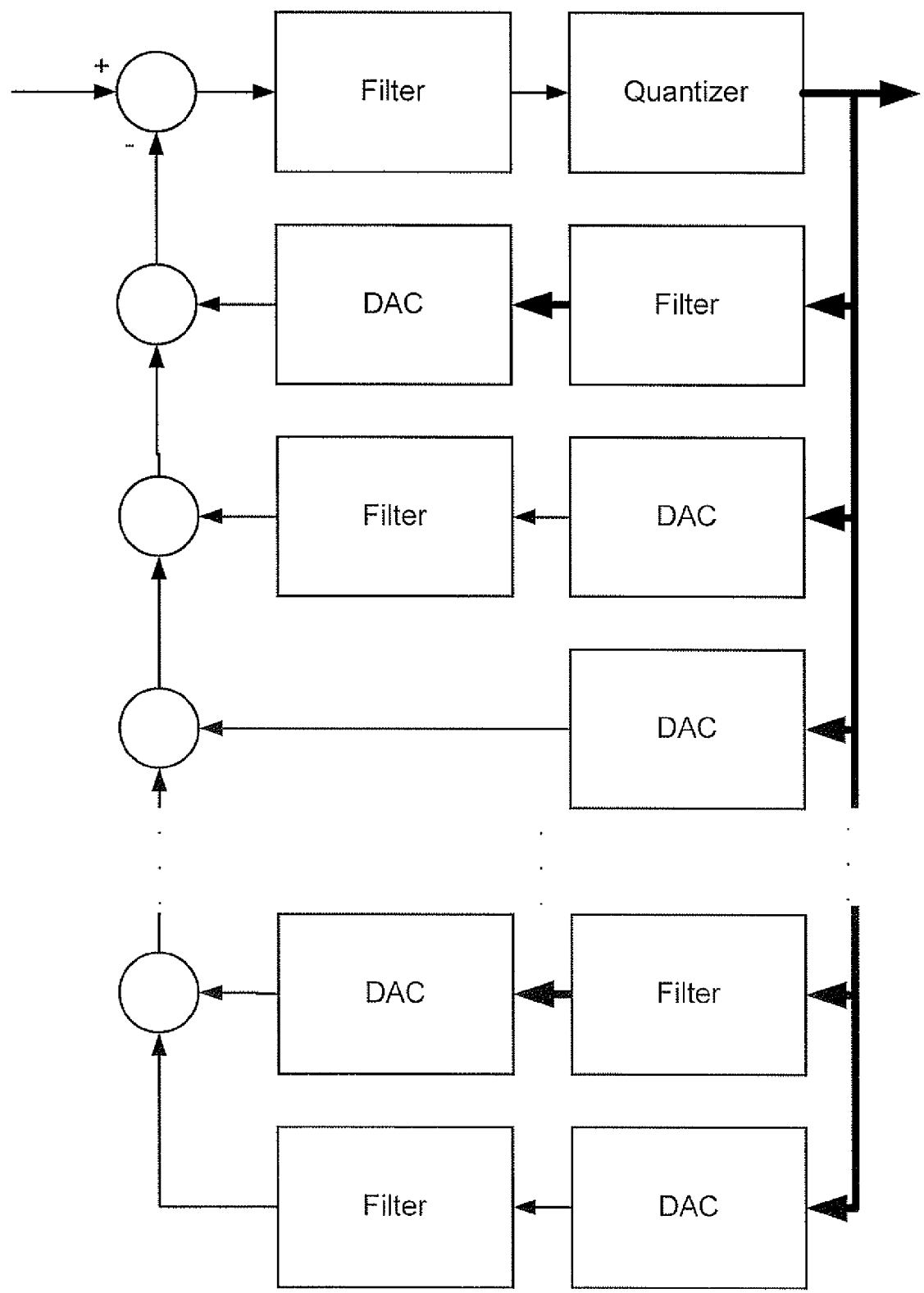

More than one filtered feedback path can be provided to distribute filter function between the feedback paths. FIGS. 5 and 6 illustrate use of two feedback paths for the application of digital and analog feedback filters, respectively. FIGS. 7 and 8 illustrate two feedback paths wherein one path applies digital filtering and the other path applies analog filtering. FIG. 9 illustrates an arbitrary mix of digital and analog feedback filter paths, together with a direct path. The same principles as demonstrated for any of the embodiments of FIGS. 1 to 4 applies.

For any of the embodiments of FIGS. 1 to 9, the sigma-delta ADC can be operated on continuous time basis, or be operated as sampled sigma-delta ADC, e.g. by switched capacitor, assuming proper alterations to any continuous-time filter are done. The same principles of the approach of the present invention applies to both these types of operation.

Figure 10:
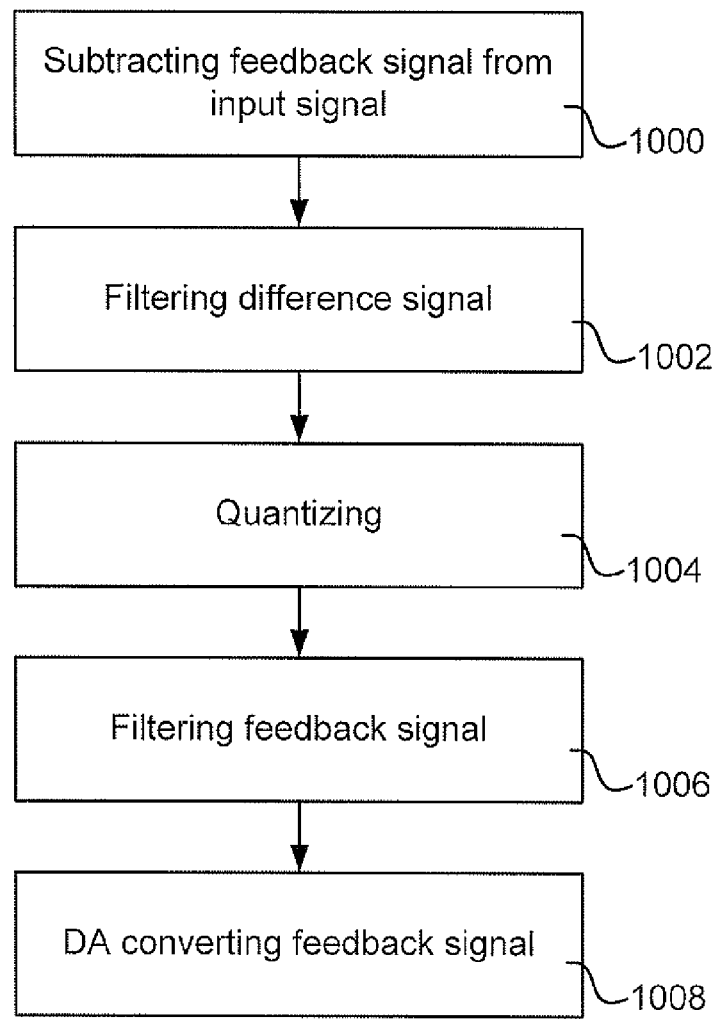
FIG. 10 is a flow chart schematically illustrating a method according to an embodiment.

FIG. 10 is a flow chart illustrating a method for delta-sigma analog-to-digital conversion according to an embodiment. In a subtraction step 1000, a feedback signal is subtracted from an input signal to a delta-sigma ADC. A difference signal is thus provided. In a difference signal filtering step 1002, the difference signal is filtered. The filtered signal is provided to a quantizer, wherein it is quantized in a quantizing step 1004 to provide a digital representation. The digital representation preferably only comprises a few bits, e.g. 1, 2 or 4 bits, but more bits can be provided in the representation, e.g. 6 or 8 bits. The digital representation is provided as output from the delta-sigma ADC, but is also provided for feedback to a feedback structure for providing the feedback signal. The feedback comprises filtering in a feedback filtering step 1006 with a certain gain to frequency characteristic, e.g. a high-pass, band-pass, or low-pass filter, such that frequencies that are desired in the analog-to-digital conversion of the radio frequency signals are attenuated in the feedback, compared to undesired frequencies. As demonstrated above, the over-all loop gain depends on the inverse of the feedback filter response, and gain for the desired frequencies is increased. The compression point for desired signals is lowered, but preserved for undesired frequencies. In a digital-to-analog conversion step 1008, the feedback signal is converted to analog domain. As demonstrated above, digital-to-analog conversion can be performed directly on the digital representation from the quantizer, or on a digitally filtered signal filtered in step 1006. In case the digital-to-analog conversion is performed directly on the digital representation from the quantizer, the filtering of step 1006 is performed in the analog domain.

The steps 1000 to 1008 are not necessarily to be considered to be performed consecutively, or in the order they are presented. They are performed in parallel and simultaneously to provide a continuous feedback flow, upon which principle it relies. The operation of the steps can be performed on a continuous-time basis or discrete-time basis, i.e. on a sampled signal.

Optionally, where the feedback structure comprises a first branch with a first feedback filter and a first digital-to-analog converter (DAC), and a second branch comprising a second DAC, the method can further comprise feeding the first and second branches by the digital representation, and subtracting the outputs of the first branch from the second branch to output the feedback signal, which then is subtracted from the input signal in the subtraction step 1000. The two DACs can be operated at the same or different bit rates, and/or at the same or different resolutions. For example, the second DAC can be operated at a higher bit rate than the first DAC. This is particularly useful when the second DAC operates directly on the digital representation and the second branch does not involve filtering. The operations of the DACs can then of course also be operated at different bit rates and/or resolutions than the quantizer. More than two feedback branches can also be used.

Figure 11:
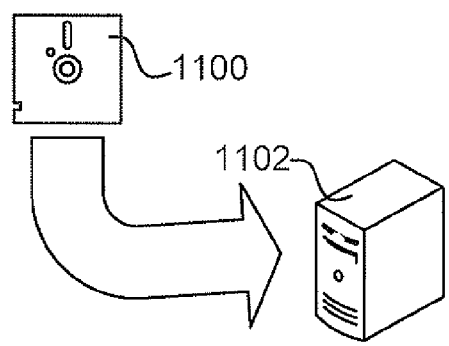
FIG. 11 schematically illustrates a computer readable medium comprising program code for computer implementation of any of the embodiments of the method according to the present invention.

The methods according to the present invention is suitable for implementation with aid of processing means, such as computers and/or processors, especially for the case where the feedback filter is a digital filter. Therefore, there is provided computer programs, comprising instructions arranged to cause the processing means, processor, or computer to perform the steps of any of the methods according to any of the embodiments described with reference to FIG. 10, in a delta-sigma ADC. The computer programs preferably comprises program code which is stored on a computer readable medium 1100, as illustrated in FIG. 11, which can be loaded and executed by a processing means, processor, or computer 1102 to cause it to perform the methods, respectively, according to embodiments of the present invention, preferably as any of the embodiments described with reference to FIG. 10. The computer 1102 and computer program product 1100 can be arranged to execute the program code sequentially where actions of the any of the methods are performed stepwise, such as upon received information on change of filter characteristics, e.g. from a communication system and indicated above, but mostly be arranged to execute the program code on a real-time basis where actions of any of the methods are performed upon need and availability of data, i.e. the ongoing operation of the delta-sigma ADC. The processing means, processor, or computer 1102 is preferably what normally is referred to as an embedded system. Thus, the depicted computer readable medium 1100 and computer 1102 in FIG. 11 should be construed to be for illustrative purposes only to provide understanding of the principle, and not to be construed as any direct illustration of the elements.

Figure 12:
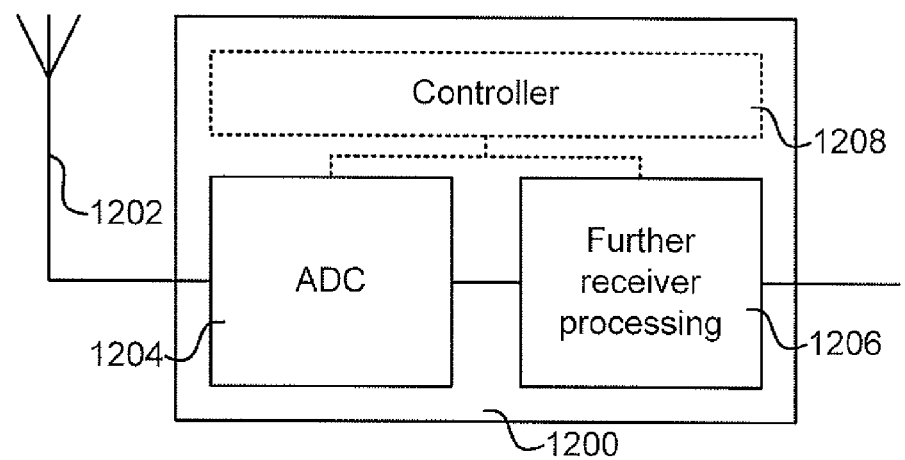
FIG. 12 is a block diagram schematically illustrating a radio receiver according to an embodiment.

FIG. 12 is a block diagram schematically illustrating a radio receiver 1200 comprising an antenna 1202 for receiving radio signals. The radio signals are provided, e.g. via a low-noise amplifier, mixer, and CSF (neither shown) to a delta-sigma ADC 1204 configured according to any of the embodiments demonstrated with reference to any of FIGS. 1 to 9. The delta-sigma ADC 1204 converts the RF signal to a digital representation, and also attenuates undesired frequencies, i.e. off-band signals, as elucidated above. The digital representation is provided to further processing in the radio receiver 1200, for example a demodulator 1206 which provides a demodulated signal as an output from the radio receiver 1200. Optionally, the radio receiver 1200 comprises a controller 1208 which can be arranged for controlling operation of the radio receiver 1200. The controller 1208 can for example provide control of the delta-sigma ADC 1204 in sense of controlling its feedback filter to adaptively work such that the delta-sigma ADC includes the CSF features as elucidated above to enhance reception of a desired band while suppressing adjacent band interferers.

Figure 13:
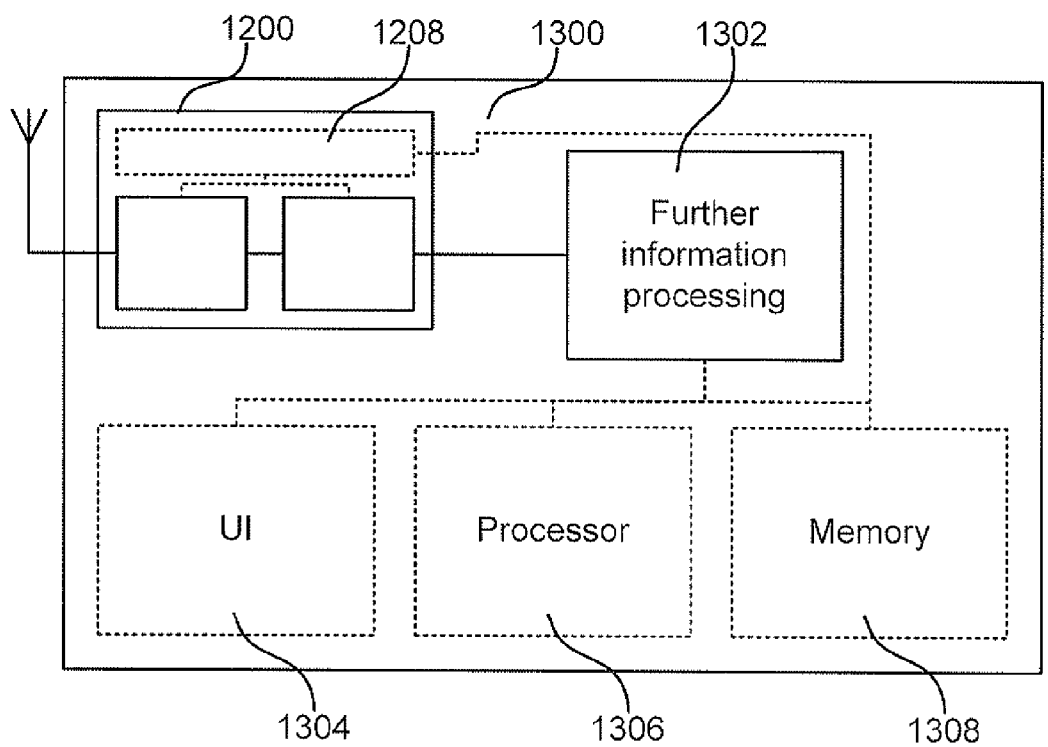
FIG. 13 is a block diagram schematically illustrating a communication apparatus according to an embodiment.

FIG. 13 is a block diagram schematically illustrating a communication apparatus 1300. The communication apparatus 1300 comprises a radio receiver 1200 according to any of the embodiments demonstrated with reference to FIG. 12, which is arranged to receive an RF signal and provide a demodulated output comprising desired information. The information is provided for further information processing in a processing block 1302. This is illustrated as a general processing block, which for example can comprise decoding, protocol handling, and higher layer processing according to the particular needs of the communication apparatus 1300. Optionally, the communication apparatus comprises a user interface 1304 for user interaction. Further optionally, the communication apparatus 1300 comprises a processor 1306 arranged to control operation of the communication apparatus 1300. The processor 1306 preferably operates in co-operation with a memory 1308 for storage of program code, system information, work information, content, etc. Optionally, the processor 1306 co-operates with the optional controller 1208 of the radio receiver, e.g. for assigning filter characteristics.

In summary, the addition of a filter in the ADC feedback path does not change $CP_o$ but since $A_f$ now varies with frequency, so will the input compression point $CP_i$. In effect, $CP_i$ is lowered for the wanted signal but preserved for off-channel signals. On the other hand, more gain is provided for the on-channel signals, enabling lowering of the gain in front of the quantizer, and for the same over-all on-channel gain, adjacent-channel $CP_i$ is effectively increased. Because of the higher ADC gain, clipping may occur on strong wanted signals. By reducing the wanted-signal attenuation in the feedback path, e.g. by letting $H_{\beta_1}=1$ or $H_{\beta_2}=0$, with the notation used above, the wanted signal gain will be reduced and, hence, increase its $CP_i$ to the same level as that of a traditional delta-sigma ADC, much like a variable gain amplifier (VGA). By varying the feedback-path bandwidth we can, thus, adopt to different radio standards and by varying its attenuation or gain we can adjust the ADC gain or $CP_i$ to varying signal levels in a flexible way.

The invention claimed is:

1. A delta-sigma analog-to-digital converter comprising:
   a forward path structure;
   a feedback structure; and
   a first subtraction element arranged to receive an input signal to the delta-sigma analog-to-digital converter and a feedback signal from the feedback structure and output a difference signal, which is a difference between the input signal and the feedback signal, to the forward path structure, wherein:
   the forward path structure comprises:
     a quantizer arranged to convert an analog input signal to a digital representation; and
     a forward path filter arranged to input the difference signal and provide an output signal to the quantizer, and
   the feedback structure comprises a first and a second branch, wherein:
   the first branch comprises:
     a first digital-to-analog converter arranged to provide output signals to the subtraction element; and
     a first feedback filter having a gain to frequency characteristic such that frequencies that are desired in the analog-to-digital conversion, compared to undesired frequencies, are attenuated in the feedback structure,
   and the second branch comprises:
     a second digital-to-analog converter,
   wherein the first and second branches are fed by the digital representation and the outputs of the first and second branches are merged in a second subtraction element arranged to output a signal, which is a difference between the signals from the first and second branches, to the first subtraction element.

2. The converter according to claim 1, wherein the feedback structure further comprises one or more further branches, wherein any of the one or more further branches comprises a digital-to-analog converter and a feedback filter having a gain to frequency characteristic such that frequencies that are desired in the analog-to-digital conversion, compared to undesired frequencies, are attenuated in the feedback structure, wherein the one or more further branches are fed by the digital representation and the outputs of the one or more further branches are merged with outputs of the first and second branches in at least one subtraction element.

3. The converter according to claim 1, wherein the first and second subtraction elements are integrated into one subtraction element.

4. The converter according to claim 1, wherein any of the first and second subtraction element comprises:
   a summing circuit; and
   a sign reversing circuit arranged on the signal path to be subtracted.

5. The converter according to claim 1, wherein any of the digital-to-analog converters are arranged to operate at different bit rates compared to each other.

6. The converter according to claim 5, wherein the second digital-to-analog converter is arranged to run at a higher bit rate than the first digital-to-analog converter.

7. The converter according to claim 1, wherein input of the second digital-to-analog converter is connected directly to the output of the quantizer.

8. The converter according to claim 1, wherein the second branch comprises a second feedback filter.

9. The converter according to claim 8, wherein any of the digital-to-analog converters are arranged to operate at different resolutions compared to each other.

10. The converter according to claim 1, wherein at least one of the feedback filters is a digital filter connected between the output of the quantizer and the input of the corresponding digital-to-analog converter.

11. The converter according to claim 1, wherein at least one of the feedback filters is an analog filter connected between the corresponding digital-to-analog converter and the input of the first subtraction element.

12. The converter according to claim 1, being arranged to operate on a continuous time basis.

13. The converter according to claim 1, being arranged to operate on a discrete time basis.

14. The converter according to claim 13, wherein at least one of the digital-to-analog converters is arranged to operate at a different bit rate than the quantizer.

15. The converter according to claim 1, wherein the forward path comprises one or more local feedback paths arranged to affect the forward path transfer function.

16. The converter according to claim 1, wherein at least one of the digital-to-analog converters is arranged to operate at a different resolution than the quantizer.

17. The converter according to claim 1, wherein gain and/or frequency response of any of the feedback filters is dynamically configurable.

18. A radio receiver comprising a delta-sigma analog-to-digital converter according to claim 1.

19. A communication apparatus comprising a radio receiver according to claim 18.

20. A method for delta-sigma analog-to-digital conversion comprising:
   subtracting a feedback signal of a feedback structure from an input signal to provide a difference signal;
   filtering the difference signal by a forward path filter to provide a forward path signal;
   quantizing the forward path signal to a digital representation;
   feeding back the digital representation by the feedback structure, wherein the feedback structure comprises a first branch comprising a first feedback filter and a first digital-to-analog converter and a second branch comprising a second digital-to-analog converter, to provide the feedback signal, wherein the feeding back comprises:
   feeding the first and second branches by the digital representation;
   filtering according to a gain to frequency characteristic such that frequencies that are desired in the analog-to-digital conversion, compared to undesired frequencies, are attenuated in the feedback structure;
   converting according to a digital-to-analog conversion in the feedback structure; and
   subtracting the outputs of the first branch from the second branch to output the feedback signal.

21. The method according to claim 20, wherein the feedback structure further comprises one or more further branches, wherein any of the one or more further branches comprises a digital-to-analog converter and a feedback filter, and the feeding back comprises:
   feeding the one or more further branches by the digital representation;
   filtering in the one or more further branches according to a gain to frequency characteristic such that frequencies that are desired in the analog-to-digital conversion, compared to undesired frequencies, are attenuated in the feedback structure;
   converting in the one or more further branches according to a digital-to-analog conversion in the feedback structure; and
   merging outputs of the one or more further branches with outputs of the first and second branches in at least one subtraction element.

22. The method according to claim 20, further comprising operating the digital-to-analog converters at different bit rate compared to each other.

23. The method according to claim 22, further comprising operating the second digital-to-analog converter at a higher bit rate than the first digital-to-analog converter.

24. The method according to claim 20, wherein the converting operated by the second digital-to-analog converter is performed directly on the digital representation.

25. The method according to claim 20, further comprising operating the digital-to-analog converters at different resolutions compared to each other.

26. The method according to claim 20, wherein the filtering in the feedback structure comprises analog filtering.

27. The method according to claim 20, wherein the filtering in the feedback structure comprises digital filtering.

28. The method according to claim 20, wherein the delta-sigma analog-to-digital conversion is operated on a continuous time basis.

29. The method according to claim 20, wherein the delta-sigma analog-to-digital conversion is operated on a discrete time basis.

30. The method according to claim 29, further comprising operating at least one of the digital-to-analog conversions at a different bit rate than the quantizing.

31. The method according to claim 20, further comprising operating at least one of the digital-to-analog conversions at a different resolution than the quantizing.

32. The method according to claim 20, wherein the forward path comprises one or more local feedback paths, and the filtering of the difference signal further comprises affecting the forward path transfer function by locally feeding back signals in the forward path.

33. The method according to claim 20, further comprising dynamically configuring gain and/or frequency response of any of the feedback filters.

34. A non-transitory computer readable storage medium having stored therein a computer program comprising computer program code comprising instructions to cause a processor on which the computer program code is executed to perform a method for delta-sigma analog-to-digital conversion, the method comprising:

subtracting a feedback signal of a feedback structure from an input signal to provide a difference signal;

filtering the difference signal by a forward path filter to provide a forward path signal;

quantizing the forward path signal to a digital representation;

feeding back the digital representation by the feedback structure, wherein the feedback structure comprises a first branch comprising a first feedback filter and a first digital-to-analog converter and a second branch comprising a second digital-to-analog converter, to provide the feedback signal, wherein the feeding back comprises:

feeding the first and second branches by the digital representation;

filtering according to a gain to frequency characteristic such that frequencies that are desired in the analog-to-digital conversion, compared to undesired frequencies, are attenuated in the feedback structure;

converting according to a digital-to-analog conversion in the feedback structure; and subtracting the outputs of the first branch from the second branch to output the feedback signal.

\* \* \* \* \*